(12) United States Patent
Atohira et al.

(10) Patent No.: US 11,135,722 B2
(45) Date of Patent: Oct. 5, 2021

(54) SIMULATION DEVICE AND SIMULATION METHOD FOR SIMULATING OPERATION OF ROBOT

(71) Applicant: FANUC CORPORATION, Yamanashi (JP)

(72) Inventors: Hiroyuki Atohira, Yamanashi (JP); Yoshiharu Nagatsuka, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 238 days.

(21) Appl. No.: 15/787,850

(22) Filed: Oct. 19, 2017

(65) Prior Publication Data
US 2018/0111268 A1 Apr. 26, 2018

(30) Foreign Application Priority Data

Oct. 26, 2016 (JP) .............................. JP2016-209493

(51) Int. Cl.
*B25J 9/16* (2006.01)
*B25J 9/00* (2006.01)
*G06F 30/20* (2020.01)

(52) U.S. Cl.
CPC ........... *B25J 9/1671* (2013.01); *B25J 9/0093* (2013.01); *B25J 9/1605* (2013.01); *B25J 9/1664* (2013.01);
(Continued)

(58) Field of Classification Search
CPC ......... B25J 9/1605; G05B 2219/39102; G05B 2219/39484; G05B 2219/39508; G05B 2219/40014; G06F 17/5009
See application file for complete search history.

(56) References Cited

U.S. PATENT DOCUMENTS

| | | | | |
|---|---|---|---|---|
| 5,243,690 A | * | 9/1993 | Chmielewski, Jr. | ... B25J 9/1697 700/259 |
| 5,463,297 A | * | 10/1995 | Hara | ................... G05B 19/4182 318/568.1 |

(Continued)

FOREIGN PATENT DOCUMENTS

| CN | 101085523 A | 12/2007 |
|---|---|---|
| CN | 101105715 A | 1/2008 |

(Continued)

OTHER PUBLICATIONS

Boschetti, Giovanni. "A picking strategy for circular conveyor tracking." Journal of Intelligent & Robotic Systems 81, No. 2 (2016, online Jun. 2015): 241-255. (Year: 2015).*

(Continued)

*Primary Examiner* — Omar F Fernandez Rivas
*Assistant Examiner* — Robert S Brock
(74) *Attorney, Agent, or Firm* — Hauptman Ham, LLP

(57) ABSTRACT

A simulation device for simulating the operations of a robot that follows a workpiece when the workpiece is conveyed by a conveyer that conveys workpieces along an arc-shaped track. The simulation device includes a robot model arranging section that arranges a robot model in virtual space; a conveyer model arranging section that arranges a conveyer model in the virtual space, the conveyer model being capable of conveying a workpiece model along an arc-shaped virtual track; a workpiece model arranging section that arranges a workpiece model on the conveyer model in the virtual space; a detection device model arranging section that arranges a detection device model in the virtual space capable of detecting the workpiece model; an operation range setting section that sets a following operation range of the robot model in the virtual space; and a simulation execution section that executes simulations.

7 Claims, 15 Drawing Sheets

(52) U.S. Cl.
CPC ............ *B25J 9/1697* (2013.01); *G06F 30/20* (2020.01); *G05B 2219/40014* (2013.01)

(56) References Cited

U.S. PATENT DOCUMENTS

| | | | |
|---|---|---|---|
| 5,727,132 A * | 3/1998 | Arimatsu | G05B 19/4083 700/259 |
| 9,776,808 B1 * | 10/2017 | Ooba | B65G 47/268 |
| 10,545,019 B2 * | 1/2020 | Racine | G01B 5/008 |
| 2002/0105296 A1 * | 8/2002 | Okuyama | B25J 9/1669 318/568.16 |
| 2007/0073444 A1 * | 3/2007 | Kobayashi | B25J 9/1671 700/264 |
| 2008/0013825 A1 * | 1/2008 | Nagatsuka | B25J 9/1671 382/153 |
| 2008/0301072 A1 * | 12/2008 | Nagatsuka | B25J 9/1669 706/12 |
| 2014/0017048 A1 * | 1/2014 | Mattern | B25J 9/1612 414/567 |
| 2018/0215034 A1 * | 8/2018 | Jean | G05B 19/4182 |
| 2020/0094997 A1 * | 3/2020 | Menon | B65B 57/14 |
| 2020/0241513 A1 * | 7/2020 | Yoshikawa | G05B 19/042 |
| 2020/0324974 A1 * | 10/2020 | Gorman | G06K 9/2054 |
| 2020/0391377 A1 * | 12/2020 | Yoneyama | B25J 9/0093 |

FOREIGN PATENT DOCUMENTS

| | | |
|---|---|---|
| CN | 101314225 A | 12/2008 |
| DE | 10162967 A1 | 7/2002 |
| JP | S59-152089 A | 8/1984 |
| JP | H9-131574 A | 5/1997 |
| JP | 2002-192486 A | 7/2002 |
| JP | 2014-100780 A | 6/2014 |
| JP | 2016-129915 A | 7/2016 |

OTHER PUBLICATIONS

Jarvis, Jacquie, Ralph Rönnquist, D. McFarlane, and L. Jain. "A team-based holonic approach to robotic assembly cell control." Journal of Network and Computer Applications 29, No. 2-3 (2005): 160-176 (Year: 2006).*

Jokesch, Michael, Mohamad Bdiwi, and Jozef Suchý. "Integration of vision/force robot control for transporting different shaped/colored objects from moving circular conveyor." In 2014 IEEE International Symposium on Robotic and Sensors Environments (ROSE) Proceedings, pp. 78-82. IEEE, 2014. (Year: 2014).*

Kim, Jaewoong, Huu Hung Nguyen, Yeonho Lee, and Sukhan Lee. "Structured light camera base 3D visual perception and tracking application system with robot grasping task." In 2013 IEEE International Symposium on Assembly and Manufacturing (ISAM), pp. 187-192. IEEE, 2013. (Year: 2013).*

* cited by examiner

SIMULATION DEVICE AND SIMULATION METHOD FOR SIMULATING OPERATION OF ROBOT

RELATED APPLICATIONS

The present application claims priority to Japanese Patent Application No. 2016-209493 filed Oct. 26, 2016, the disclosure of which is hereby incorporated by reference herein in its entirety.

BACKGROUND OF THE INVENTION

1. Field of the Invention

The invention relates to a simulation device that simulates the operations of a robot, and a simulation method.

2. Description of the Related Art

Devices that simulate the operations of a robot that grips a workpiece are known (e.g. JP-A-2016-129915 and JP-A-2014-100780).

However, there is a need for technology for simulating the operations of a robot that follows a workpiece when the workpiece is conveyed by a conveyer that conveys workpieces along an arc-shaped track.

SUMMARY OF THE INVENTION

In an aspect of the invention, a simulation device is configured to simulate an operation of a robot with a robot hand causing the robot hand to follow moving a workpiece. The simulation device includes a robot model arranging section configured to arrange a robot model including a robot hand model in virtual space, wherein the robot model is a three-dimensional model of the robot, and the robot hand model is a three-dimensional model of the robot hand.

The simulation device includes a conveyer model arranging section configured to arrange a conveyer model in the virtual space, wherein the conveyer model is a three-dimensional model of a conveyer configured to convey the workpiece along an arc-shaped track. At least a part of a virtual track in the virtual space corresponding to the arc-shaped track is included in a virtual movable range in which the robot model can move the robot hand model.

The simulation device includes a workpiece model arranging section configured to arrange a workpiece model on the conveyer model in the virtual space, the workpiece model being a three-dimensional model of the workpiece; and a detection device model arranging section configured to arrange a detection device model in the virtual space such that the detection device model can detect the workpiece model conveyed by the conveyer model, the detection device model being a three-dimensional model of a detection device configured to detect the workpiece.

The simulation device includes an operation range setting section configured to set a following operation range, in which the robot model causes the robot hand model to follow the workpiece model conveyed by the conveyer model, in the virtual space.

The simulation device includes a simulation execution section configure to execute a simulation in which the conveyer model conveys the workpiece model, the detection device model detects the conveyed workpiece model, and the robot model causes the robot hand model to follow the workpiece model within the following operation range based on a virtual detection result of the workpiece model obtained by the detection device model.

The simulation execution section may execute the simulation in which the robot model grips the workpiece model by the robot hand model when the robot model causes the robot hand model to follow the workpiece model within the following operation range, and conveys the gripped workpiece model to a location in the virtual space different from the conveyer model.

The robot model arranging section may arrange a second robot model with a second robot hand model in the virtual space. The simulation execution section may execute the simulation in which the second robot model grips the workpiece model, which is arranged at a location in the virtual space different from the conveyer model, by the second robot hand model, and places the gripped workpiece model on the conveyer model.

The simulation device may be further provided with a track determination section configured to determine a radius of the virtual track. In this case, the simulation execution section may be configured to execute the simulation in which the robot model causes the robot hand model to follow the workpiece model based on the virtual detection result and the radius.

The simulation device may be further provided with a model position determination section configured to determine a position of the detection device model in the virtual space such that the detection device model is arranged above the virtual track in the virtual space, based on the radius determined by the track determination section.

In another aspect of the invention, a simulation method of simulating an operation of a robot with a robot hand causing the robot hand to follow a moving workpiece, includes arranging a robot model including a robot hand model in virtual space, wherein the robot model is a three-dimensional model of the robot, and the robot hand model is a three-dimensional model of the robot hand.

The method includes arranging a conveyer model in the virtual space, wherein the conveyer model is a three-dimensional model of a conveyer configured to convey the workpiece along an arc-shaped track. At least a part of a virtual track in the virtual space corresponding to the arc-shaped track is included in a virtual movable range in which the robot model can move the robot hand model.

The method includes arranging a workpiece model on the conveyer model in the virtual space, the workpiece model being a three-dimensional model of the workpiece; and arranging a detection device model in the virtual space such that the detection device model can detect the workpiece model conveyed by the conveyer model, the detection device model being a three-dimensional model of a detection device configured to detect the workpiece.

The method includes setting a following operation range, in which the robot model causes the robot hand model to follow the workpiece model conveyed by the conveyer model, in the virtual space.

The method includes executing a simulation in which the conveyer model conveys the workpiece model, the detection device model detects the conveyed workpiece model, and the robot model causes the robot hand model to follow the workpiece model within the following operation range based on a virtual detection result of the workpiece model obtained by the detection device model.

In still another aspect of the invention, a computer program is configured to cause a computer to execute the method described above.

BRIEF DESCRIPTION OF THE DRAWINGS

The above-described and other objects, features and advantages of the invention will become more apparent from the following description of the embodiments in connection with the accompanying drawings, in which.

DETAILED DESCRIPTION

Figure 1:
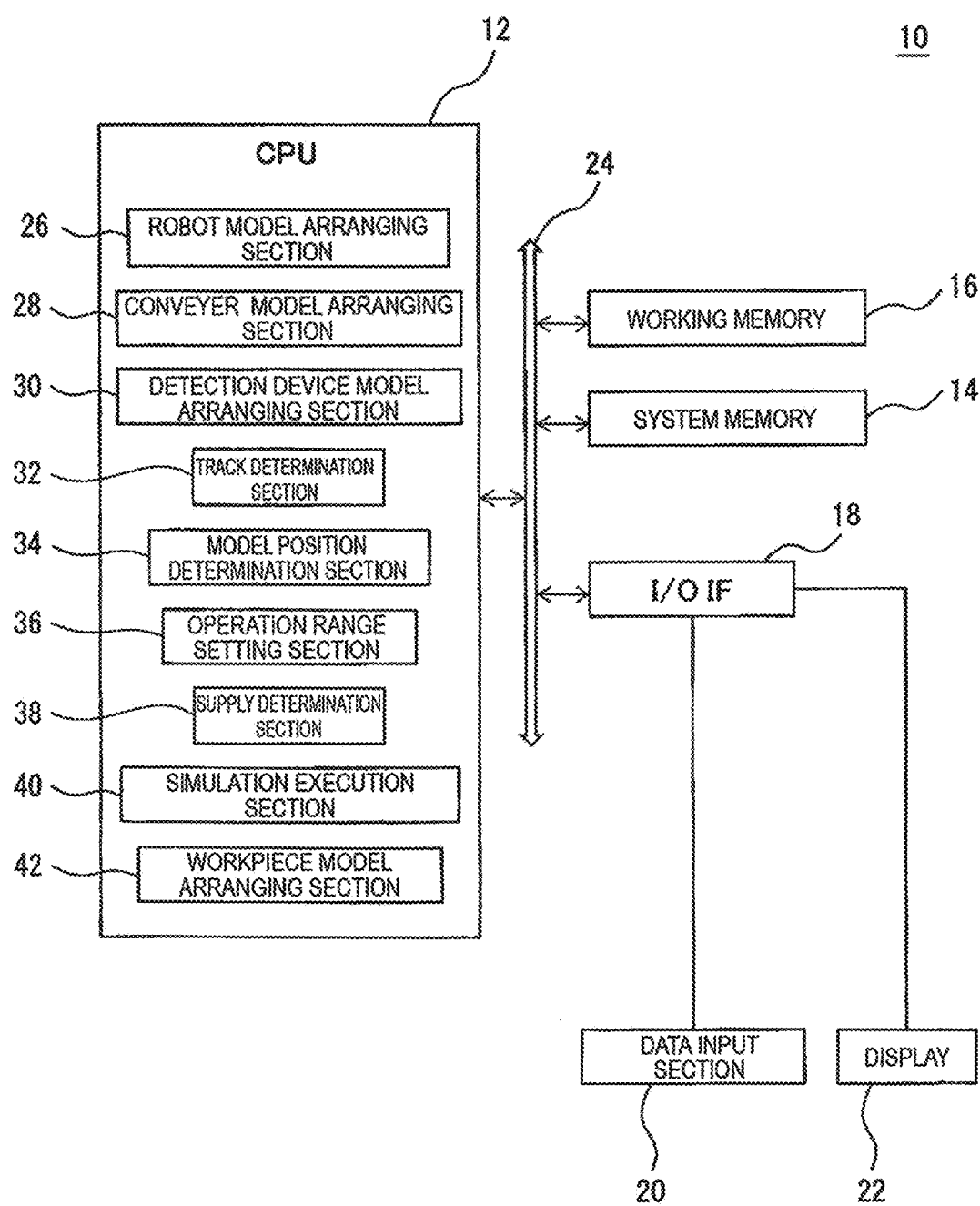
FIG. 1 is a block diagram of a simulation device according to an embodiment.

Hereinafter, embodiments of the invention are described in detail with reference to the drawings. Note that, in the various embodiments described below, similar elements are assigned the same reference numeral, and repetitive descriptions thereof will be omitted.

A simulation device 10 according to an embodiment is described with reference to FIG. 1. The simulation device 10 includes a CPU 12, a system memory 14, a working memory 16, an input/output interface (I/O interface) 18, a data input section 20, and a display 22.

The CPU 12 is communicably connected to the system memory 14, the working memory 16, and the I/O interface 18 via a bus 24, and executes the following various processes while communicating with these components.

The system memory 14 is nonvolatile memory that is electrically erasable and recordable, and is comprised of EEPROM (registered trademark) or the like. The system memory 14 records constants, variables, setting values, programs and the like which are necessary for executing the simulation described later so as not to lose them when the simulation device 10 is shut down.

The working memory 16 temporarily stores data necessary for the CPU 12 to execute the various processes. Additionally, the constants, variables, setting values, programs and the like recorded on the system memory 14 are appropriately deployed in the working memory 16, and the CPU 12 makes use of the data deployed in the working memory 16 to execute the various processes.

The I/O interface 18 is communicably connected to the data input section 20, and receives data from the data input section 20 in accordance with a command from the CPU 12. Additionally, the I/O interface 18 is communicably connected to the display 22, and sends image data to the display 22 in accordance with a command from the CPU 12.

The I/O interface 18 is comprised of e.g. an Ethernet port or a USB port, and may wiredly communicate the display 22 and the data input section 20. Alternatively, the I/O interface 18 may wirelessly communicate the display 22 and the data input section 20 via e.g. Wi-Fi or other wireless LAN.

The data input section 20 is comprised of e.g. a keyboard, a touch panel, or a mouse, and a user can input data by operating the data input section 20. The data input section 20 sends the input data to the CPU 12 via the I/O interface 18.

The display 22 is comprised of e.g. a CRT, a liquid crystal display (LCD), or an organic EL display. The display 22 receives image data sent from the I/O interface 18, and displays it as an image viewable by a user.

The simulation device 10 is for simulating an operation of a workpiece conveyer system causing a robot hand to follow and grip a moving workpiece.

Figure 2:
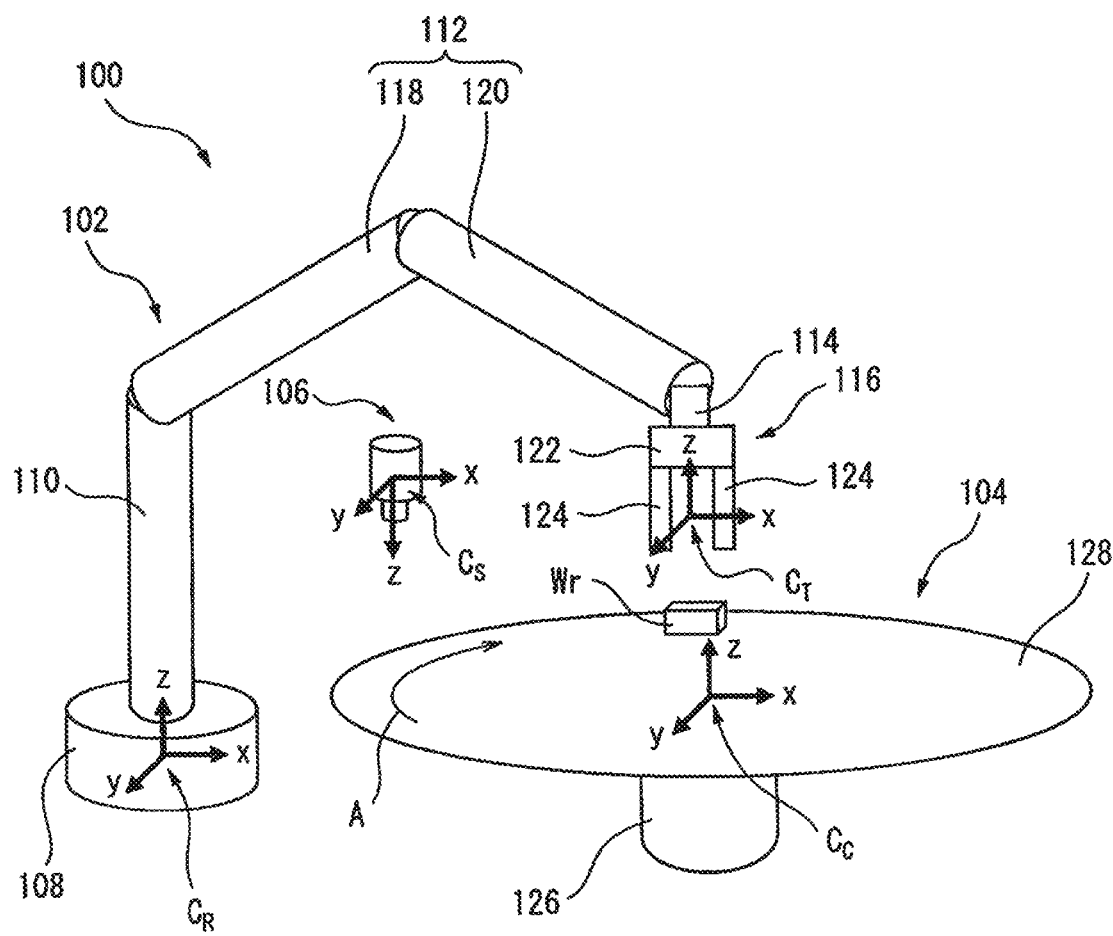
FIG. 2 is a drawing of a conveyer system according to an embodiment in real space.

Hereinafter, an example of a workpiece conveyer system 100 in real space is described with reference to FIG. 2. The workpiece conveyer system 100 includes a robot 102, a conveyer 104, and a detection device 106.

The robot 102 is a vertical articulated robot, and includes a robot base 108, a revolving drum 110, a robot arm 112, a wrist 114, and a robot hand 116. The robot base 108 is fixed on the floor of a work cell in the real space.

The revolving drum 110 is rotatably provided at the robot base 108. The robot arm 112 includes an upper arm 118 rotatably connected to the revolving drum 110, and a forearm 120 rotatably connected to a distal end of the upper arm 118. The wrist 114 is connected to a distal end of the forearm 120, and supports the robot hand 116 so as to rotate about three axes.

The robot hand 116 includes a hand base 122 connected to the wrist 114, and a plurality of fingers 124 provided at the hand base 122 so as to open and close. The robot hand 116 releasably grips a workpiece $W_r$.

The robot 102 has a robot coordinate system $C_R$, and operates each component of the robot 102 with using the robot coordinate system $C_R$ as a standard. For example, the z-axis of the robot coordinate system $C_R$ is disposed to be parallel to the vertical direction in real space, wherein the revolving drum 110 rotates about the z-axis of the robot coordinate system $C_R$.

A tool coordinate system $C_T$ is set for the robot hand 116. This tool coordinate system $C_T$ is a coordinate system that defines the position and orientation of the robot hand 116 in the robot coordinate system $C_R$.

For example, the tool coordinate system $C_T$ is set such that the origin of the tool coordinate system $C_T$ is positioned between the fingers 124 of the robot hand 116, and the z-axis of the tool coordinate system $C_T$ is orthogonal to the opening and closing direction of the fingers 124.

The robot 102 operates the revolving drum 110, the robot arm 112, and the wrist 114 in the robot coordinate system $C_R$ so as to match the position and orientation of the robot hand 116 with the position and orientation defined by the tool coordinate system $C_T$.

The conveyer 104 includes a base 126 and a turntable 128. The base 126 is fixed on the floor of the work cell in the real space. The turntable 128 is rotatably mounted on the base 126.

The conveyer 104 has a conveyer coordinate system $C_C$. For example, the z-axis of the conveyer coordinate system $C_C$ is arranged parallel to the vertical direction in the real space, wherein the conveyer 104 rotates the turntable 128 about the z-axis of the conveyer coordinate system $C_C$ in the direction indicated by arrow A in FIG. 2. The workpiece $W_r$ is placed on the turntable 128, and the conveyer 104 conveys the workpiece $W_r$ placed on the turntable 128 along the arc-shaped track.

The detection device 106 is provided upward (i.e., the z-axis plus direction of the conveyer coordinate system $C_C$) of the turntable 128, and can detect the workpiece $W_r$ conveyed by the turntable 128. The detection device 106 is e.g. a three-dimensional visual sensor, and images the workpiece $W_r$ so as to capture the image of the workpiece $W_r$.

The detection device 106 has a sensor coordinate system $C_s$. For example, the z-axis plus direction of the sensor coordinate system $C_s$ is set to coincide with the visual line direction of the detection device 106 and with the vertically downward direction in the real space.

Next, the operation of the workpiece conveyer system 100 will be described. First, the workpiece $W_r$ is placed on the stopped turntable 128 at a predetermined supply position. The supply position is arranged upstream of the detection device 106 in the rotation direction of the turntable 128.

Next, the conveyer 104 rotates the turntable 128, thereby the workpiece $W_r$ placed on the turntable 128 is rotated in the direction A.

Then, the detection device 106 detects the workpiece $W_r$ placed on the turntable 128. Specifically, the detection device 106 images the workpiece $W_r$ on the turntable 128 so as to capture the image of the workpiece $W_r$.

Then, the robot 102 acquires the position and orientation of the workpiece $W_r$ in the robot coordinate system $C_R$, based on the detected image of the workpiece $W_r$ acquired by the detection device 106. Then, the robot 102 sets the tool coordinate system $C_T$ based on the acquired position and orientation such that the origin of the tool coordinate system $C_T$ is continuously arranged at a predetermined position in the workpiece $W_r$ (e.g. the center position of the workpiece $W_r$) being conveyed.

The robot 102 operates the revolving drum 110, the robot arm 112, and the wrist 114 so as to arrange the robot hand 116 at the position and orientation defined by the tool coordinate system $C_T$. In this way, the robot 102 causes the robot hand 116 to follow the workpiece $W_r$ being conveyed.

Then, the robot 102 closes the fingers 124 to grip the workpiece $W_r$ by the fingers 124. Thus, the conveyed workpiece Wr is gripped by the robot hand 116.

The simulation device 10 according to this embodiment simulates the operation of the workpiece conveyer system 100 as described above.

Next, the operation of the simulation device 10 will be described with reference to FIG. 3. Note that, in the present specification, if the name of the component of the work conveyer system in the real space is "XX," the three-dimensional model in virtual space of this component is referred to as "XX model." For example, the three-dimensional model of the "robot hand" in the real space is referred to as a "robot hand model."

Figure 3:
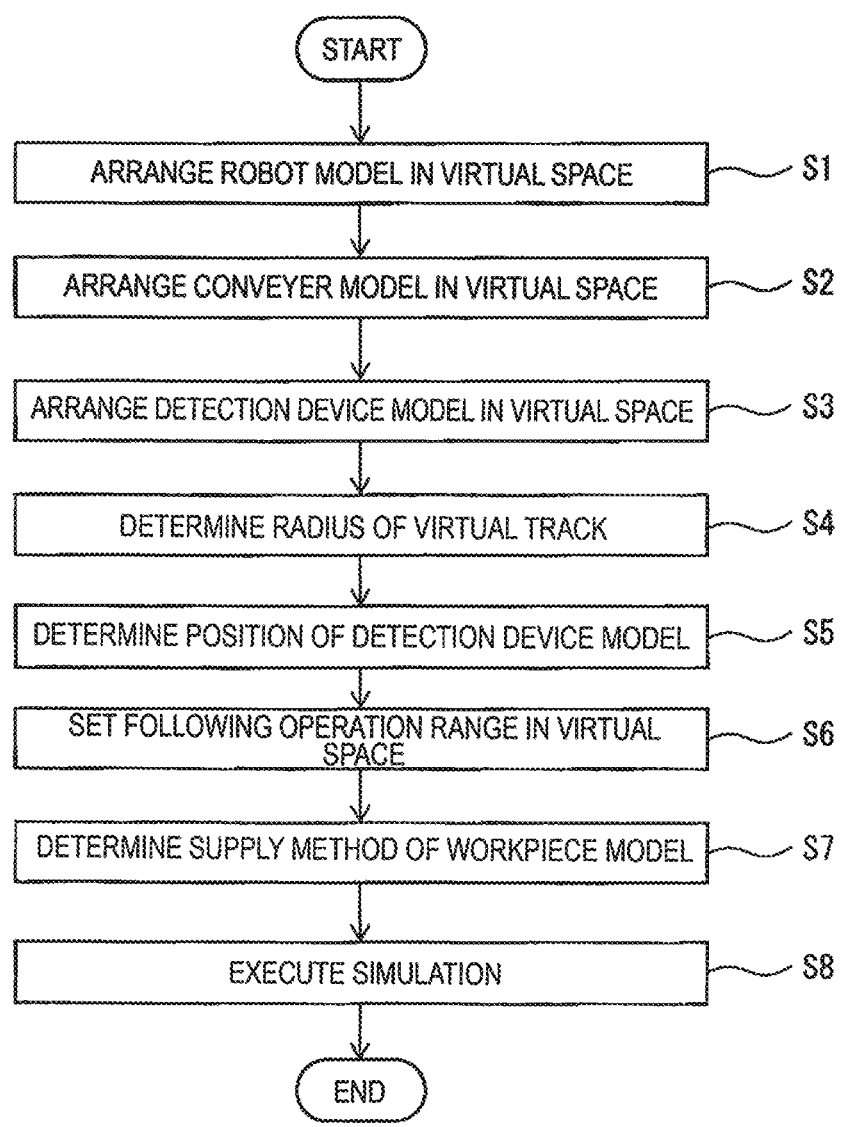
FIG. 3 is a flowchart illustrating an example of an operation flow of the simulation device illustrated in FIG. 1.

The flow illustrated in FIG. 3 is started when a user operates the data input section 20 to input a simulation start command and the CPU 12 receives this simulation start command from the data input section 20, for example.

Note that, the CPU 12 may carry out steps S1 to S8 illustrated in FIG. 3 in accordance with a computer program. In this case, the computer program may be prestored in the system memory 14.

In step S1, the CPU 12 arranges a robot model in virtual space. The system memory 14 pre-stores a plurality of robot models of a plurality of types of robots including the above-mentioned robot 102.

As an example, the CPU 12 generates image data in which the plurality of types of robot models stored in the system memory 14 are represented in the form of a list, and displays it on the display 22. The user operates the data input section 20 and selects a desired robot model from the list displayed on the display 22.

Below, a case in which the user selects a robot model 102M (FIG. 4) of the above-mentioned robot 102 will be described. The data input section 20 sends the input data input by the user to the CPU 12 via the I/O interface 18.

In response to the received input data, the CPU 12 reads out the robot model 102M from the plurality of types of robot models stored in the system memory 14, and arranges the robot model 102M in virtual space. Then, the CPU 12 generates the virtual space as image data, and displays it on the display 22.

Figure 4:
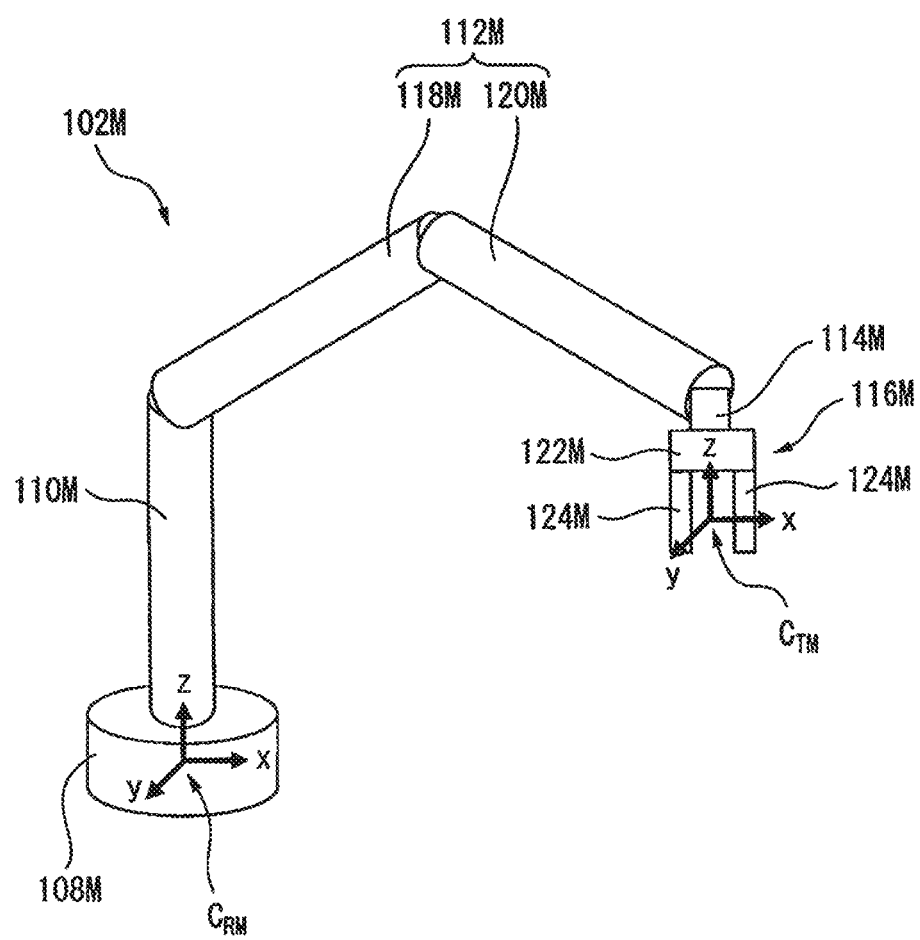
FIG. 4 illustrates an example of an image of virtual space when step S1 in FIG. 3 is executed.

FIG. 4 illustrates an example of an image of virtual space 200 displayed on the display 22 in this manner. In the virtual space 200 illustrated in FIG. 4, the robot model 102M including a robot base model 108M, a revolving drum model 110M, a robot arm model 112M, a wrist model 114M, and a robot hand model 116M is arranged.

The system memory 14 stores various virtual operation parameters that are associated with the robot model 102M. These virtual operation parameters are parameters corresponding to operating parameters needed to operate the robot 102 in real space.

For example, the virtual operation parameters include a robot coordinate system model $C_{RM}$ in the virtual space 200 corresponding to the above-mentioned robot coordinate system $C_R$, a tool coordinate system model $C_{TM}$ in the virtual space 200 corresponding to the above-mentioned tool coordinate system $C_T$, and a virtual movable range.

The virtual movable range is a range in the virtual space 200 corresponding to a movable range in which the robot 102 can move the robot hand 116 in the real space (i.e., a range in which the tool coordinate system $C_T$ can be set).

As illustrated in FIG. 4, the CPU 12 arranges the robot coordinate system model $C_{RM}$ and the tool coordinate system model $C_{TM}$ in the virtual space 200, together with the robot model 102M. Thus, in this embodiment, the CPU 12 functions as a robot model arranging section 26 (FIG. 1) configured to arrange the robot model 102M in the virtual space 200.

In step S2, the CPU 12 arranges a conveyer model in the virtual space 200. The system memory 14 pre-stores a plurality of types of conveyer models of a plurality of types of conveyers including the above-mentioned conveyer 104.

As an example, the CPU 12 generates image data in which the plurality of types of conveyer models stored in the system memory 14 are represented in the form of a list, and displays it on the display 22. The user operates the data input section 20 and selects a desired conveyer model from the list displayed on the display 22. Below, a case in which the user selects a conveyer model 104M (FIG. 5) of the above-mentioned conveyer 104 will be described. The data input section 20 sends the input data input by the user to the CPU 12 via the I/O interface 18.

In response to the received input data, the CPU 12 reads out the conveyer model 104M from the plurality of types of conveyer models stored in the system memory 14, and arranges the conveyer model 104M in the virtual space 200.

At this time, the CPU 12 arranges the conveyer model 104M in the virtual space 200 such that entire region of a turntable model 128M is included in the virtual movable range of the robot model 102M.

Figure 5:
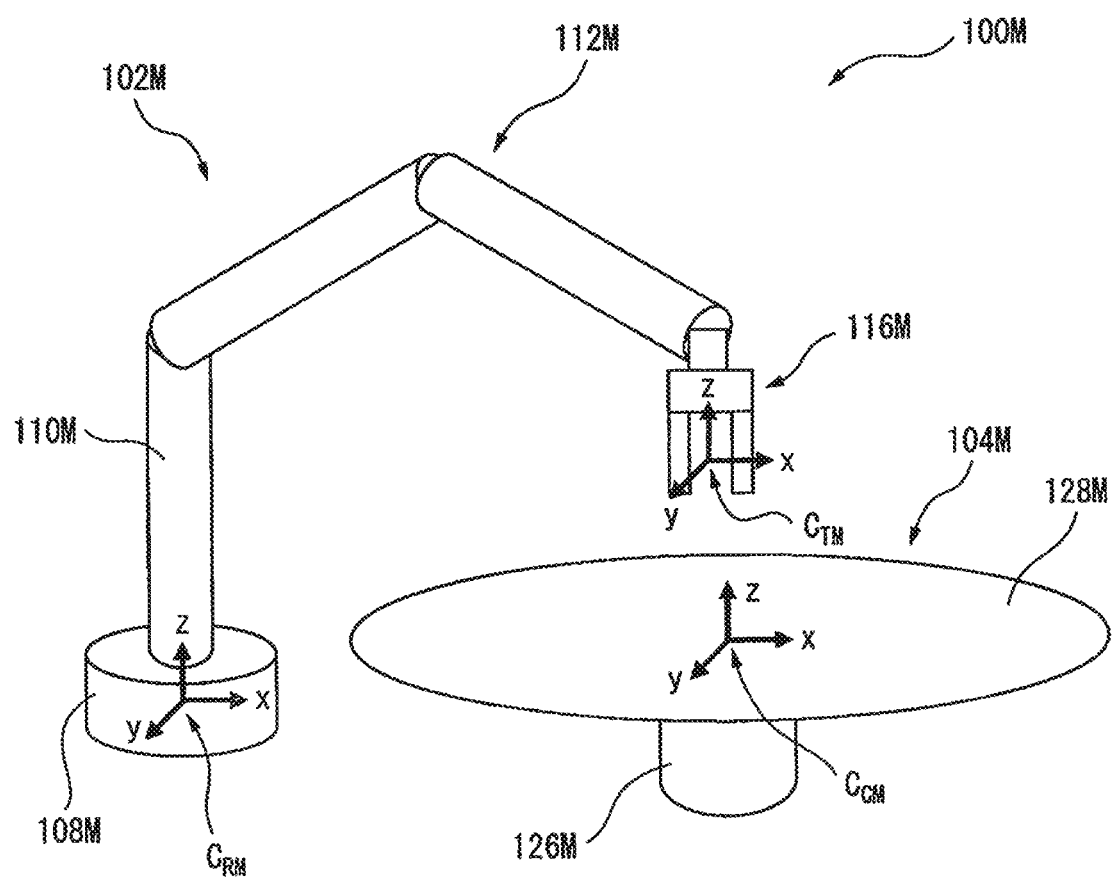
FIG. 5 illustrates an example of an image of the virtual space when step S2 in FIG. 3 is executed.

In addition, the CPU 12 arranges a conveyer coordinate system model $C_{CM}$ corresponding to the above-mentioned conveyer coordinate system $C_C$ in the virtual space 200. In this way, as illustrated in FIG. 5, the conveyer model 104M including a base model 126M and the turntable model 128M is arranged in the virtual space 200.

Thus, in this embodiment, the CPU 12 functions as a conveyer model arranging section 28 (FIG. 1) configured to arrange the conveyer model 104M in the virtual space 200.

Note that, when the conveyer model 104M is arranged in the virtual space 200, the CPU 12 may move the conveyer model 104M and the conveyer coordinate system model $C_{CM}$ in the virtual space 200 in response to input data from the data input section 20.

For example, when the conveyer model 104M is arranged in the virtual space 200, the user operates the data input section 20 (e.g. a mouse) so as to move (e.g. drag and drop) the conveyer model 104M displayed on the display 22.

The CPU 12 moves the conveyer model 104M in the virtual space 200 in accordance with the input data from the data input section 20 input by the user. At this time, the CPU 12 may prohibit the movement of the conveyer model 104M or display a warning image on the display 22, if the position of the moved conveyer model 104M is out of the virtual movable range of the robot model 102M.

In step S3, the CPU 12 arranges a detection device model in the virtual space 200. The system memory 14 pre-stores a plurality of detection device models of a plurality of types of detection devices including the above-mentioned detection device 106.

As an example, the CPU 12 generates image data in which the plurality of types of detection device models stored in the system memory 14 are represented in the form of a list, and displays it on the display 22. The user operates the data input section 20 and selects a desired detection device model from the list displayed on the display 22.

Below, a case in which the user selects a detection device model 106M (FIG. 6) of the above-mentioned detection device 106 will be described. The data input section 20 sends the input data input by the user to the CPU 12 via the I/O interface 18.

In response to the received input data, the CPU 12 reads out the detection device model 106M from the plurality of types of detection device models stored in the system memory 14, and arranges the detection device model 106M in the virtual space 200.

At this time, the CPU 12 arranges the detection device model 106M such that the detection device model 106M is positioned upward (i.e., the z-axis plus direction of the conveyer coordinate system model $C_{CM}$) of the turntable model 128M.

Figure 6:
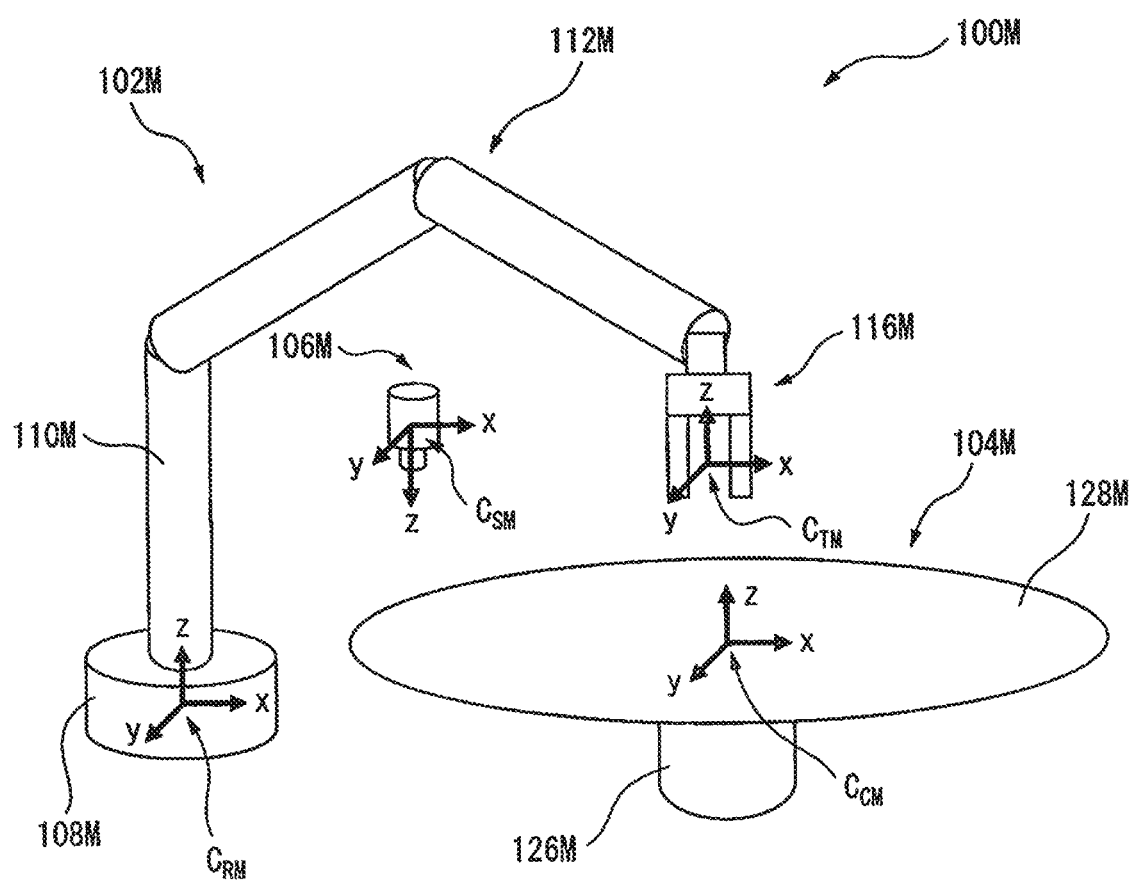
FIG. 6 illustrates an example of an image of the virtual space when step S3 in FIG. 3 is executed.

In addition, the CPU 12 arranges a sensor coordinate system model $C_{SM}$ corresponding to the above-mentioned sensor coordinate system $C_S$ in the virtual space 200. In this manner, as illustrated in FIG. 6, the detection device model 106M is arranged in the virtual space 200.

Thus, in this embodiment, the CPU 12 functions as a detection device model arranging section 30 (FIG. 1) configured to arrange the detection device model 106M in the virtual space 200.

As a result of this step S3, a conveyer system model 100M including the robot model 102M, the conveyer model 104M, and the detection device model 106M is constructed in the virtual space 200.

Figure 7:
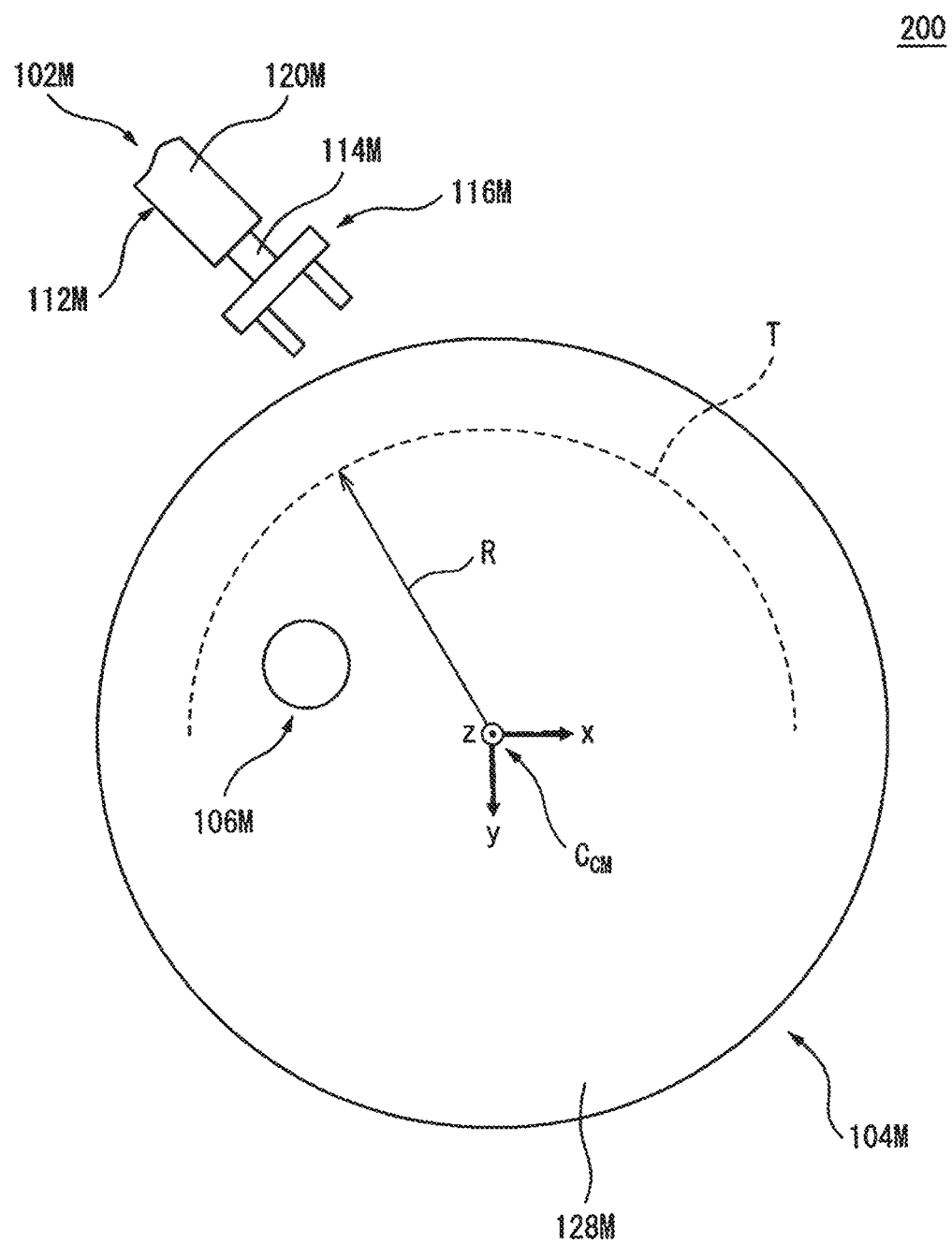
FIG. 7 is a drawing for explaining step S4 in FIG. 3, and is a drawing of the virtual space illustrated in FIG. 6 as seen from z-axis plus direction of a conveyer coordinate system model $C_{CM}$.

In step S4, the CPU 12 determines a radius R of a virtual track T (FIG. 7). The virtual track T is a track in the virtual space 200 corresponding to the arc-shaped track in the real space on which the conveyer 104 conveys the workpiece $W_r$ by the turntable 128.

In other words, the virtual track T is a track in the virtual space 200 on which the conveyer model 104M conveys the workpiece model placed on the turntable model 128M by the turntable model 128M when step S8 described later is carried out.

The virtual track T defines a position on the turntable model 128M when the workpiece model is placed on the turntable model 128M in the virtual space 200 at step S8 described later.

As an example, the CPU 12 generates input image data that enables the user to input the radius R of the virtual track T, and displays it on the display 22. The user operates the data input section 20 and inputs a desired radius R on the input image displayed on the display 22.

The data input section 20 sends the input data of the radius R input by the user to the CPU 12 via the I/O interface 18. The CPU 12 determines the radius R of the virtual track T in accordance with the received input data. As a result, the radius R of the virtual track T is determined as illustrated in FIG. 7. In this embodiment, the radius R corresponds to the radius of a circle centered about the z-axis of the conveyer coordinate system model $C_{CM}$.

Thus, in this embodiment, the CPU 12 functions as a track determination section 32 (FIG. 1) configured to determine the radius R of the virtual track T.

Note that, the radius R of the virtual track T may be defined as a distance (e.g. 10 mm) from the outer circumferential edge of the turntable model 128M. In this case, the CPU 12 generates input image data that enables the user to input the distance from the outer circumferential edge of the turntable model 128M, and displays it on the display 22. The CPU 12 determines the radius R of the virtual track T in accordance with the input distance from the outer circumferential edge.

In step S5, the CPU 12 determines the position of the detection device model 106M. Specifically, the CPU 12 determines the position of the detection device model 106M arranged in the virtual space 200 in the above-mentioned step S3, such that the z-axis of the sensor coordinate system model $C_{SM}$ thereof is arranged upward (i.e., the z-axis plus direction of the conveyer coordinate system model $C_{CM}$) of the virtual track T determined in the above-mentioned step S4.

Figure 8:
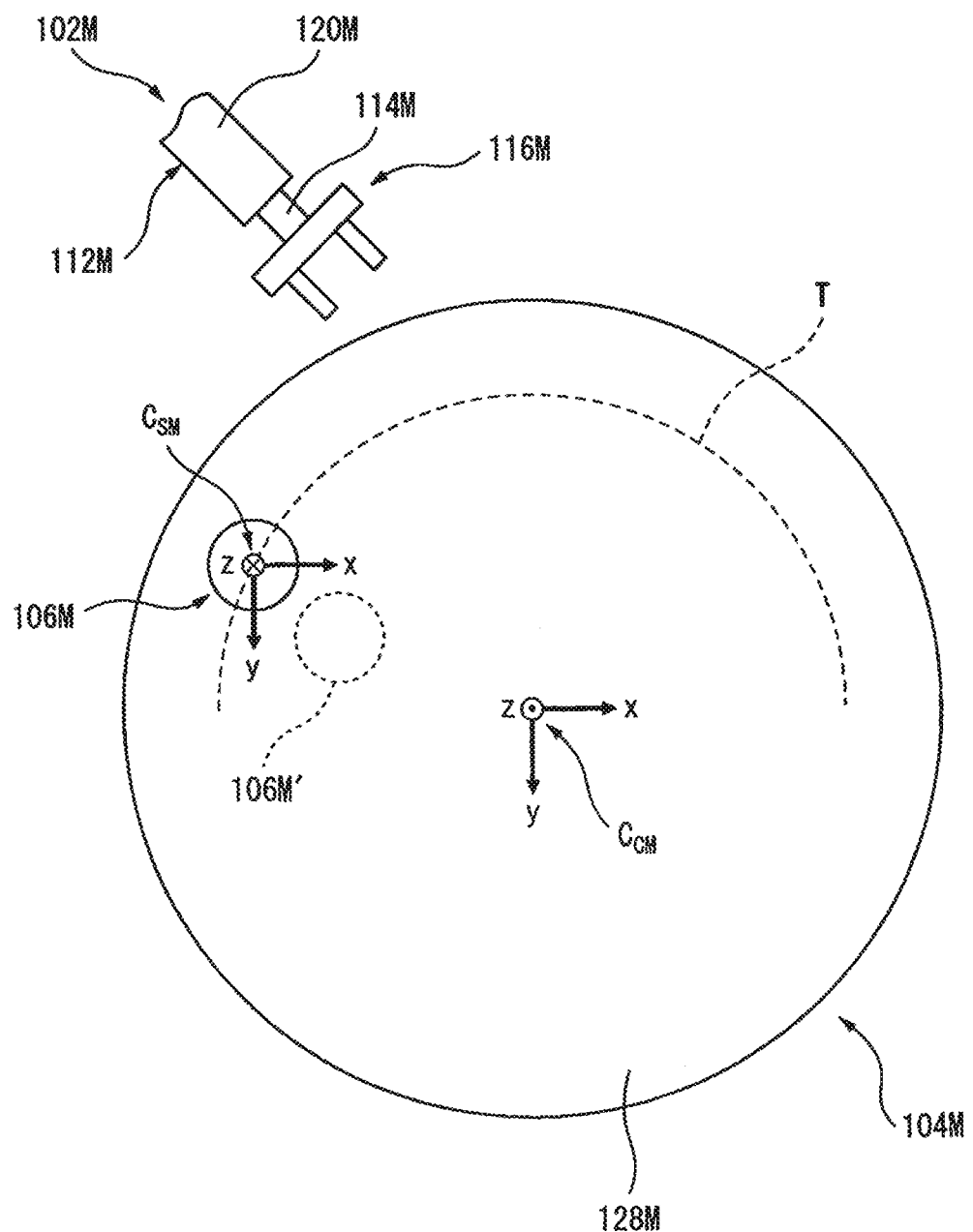
FIG. 8 is a drawing for explaining step S5 in FIG. 3, and corresponds to the image of the virtual space illustrated in FIG. 7.

Then, as illustrated in FIG. 8, the CPU 12 moves the position of the detection device model 106M in the virtual space 200 from the position at the time of end of step S3 illustrated by a dashed line 106M' in FIG. 8. As a result, the detection device model 106M is positioned with respect to the turntable model 128M such that the z-axis of the sensor coordinate system model $C_{SM}$ thereof is arranged above the virtual track T.

Thus, in this embodiment, the CPU 12 functions as a model position determination section 34 (FIG. 1) configured to determine the position of the detection device model 106M.

In step S6, the CPU 12 sets a following operation range in the virtual space 200. The following operation range is an operation range in the virtual space 200 in which the robot model 102M causes the robot hand model 116M to follow the workpiece model conveyed by the conveyer model 104M when step S8 described later is carried out.

As an example, the CPU 12 generates input image data that enables the user to input an angle θ (FIG. 10) which defines the following operation range, and displays it on the display 22. The user operates the data input section 20 and inputs a desired angle θ on the input image displayed on the display 22.

The data input section 20 sends the input data of the angle θ input by the user to the CPU 12 via the I/O interface 18. In accordance with the received input data, the CPU 12 sets an upstream end 202 and a downstream end 204 of the following operation range on the virtual track T determined in step S4.

Figure 9:
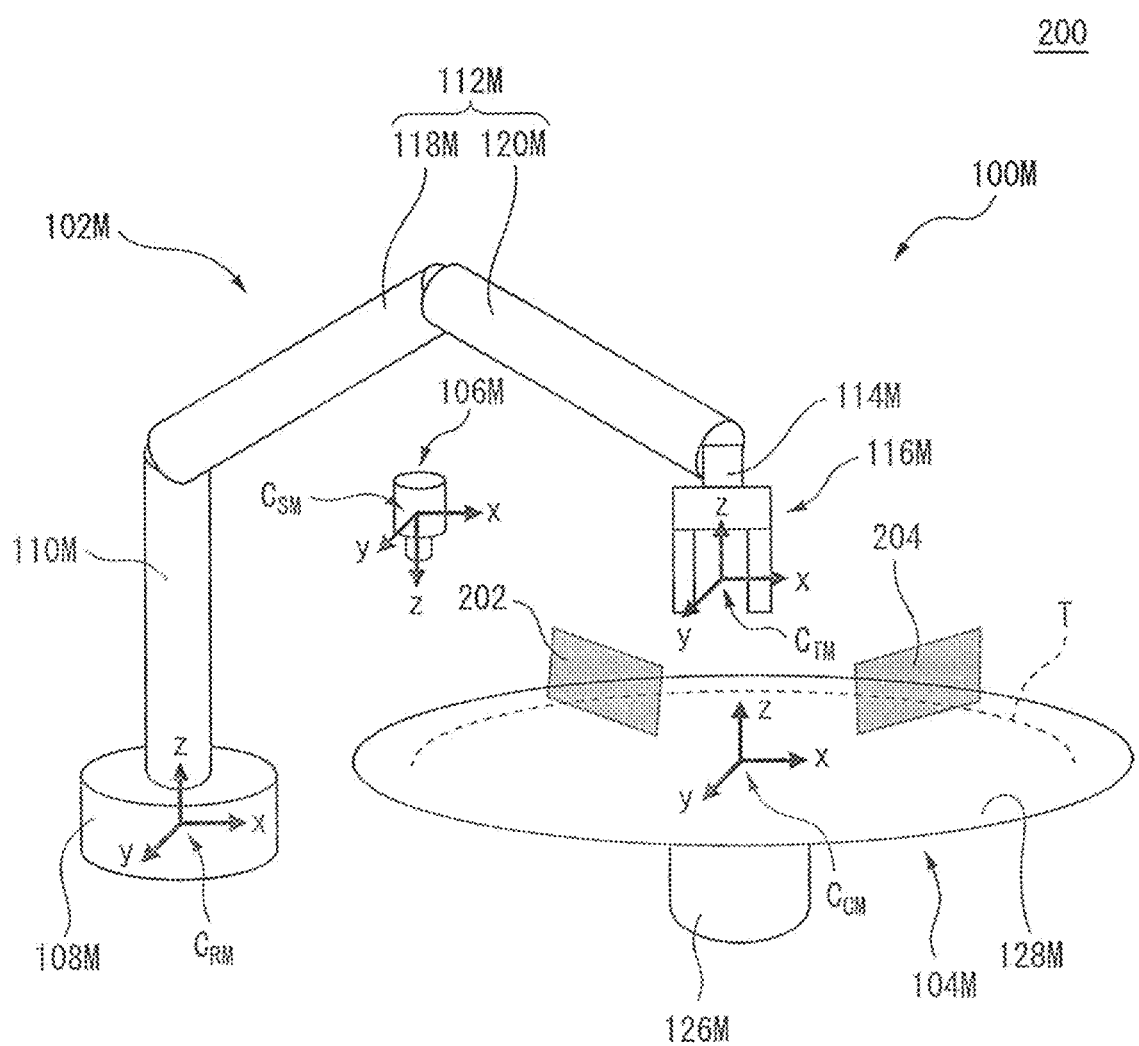
FIG. 9 is a drawing for explaining step S6 in FIG. 3, and corresponds to the image of the virtual space illustrated in FIG. 6.
Figure 10:
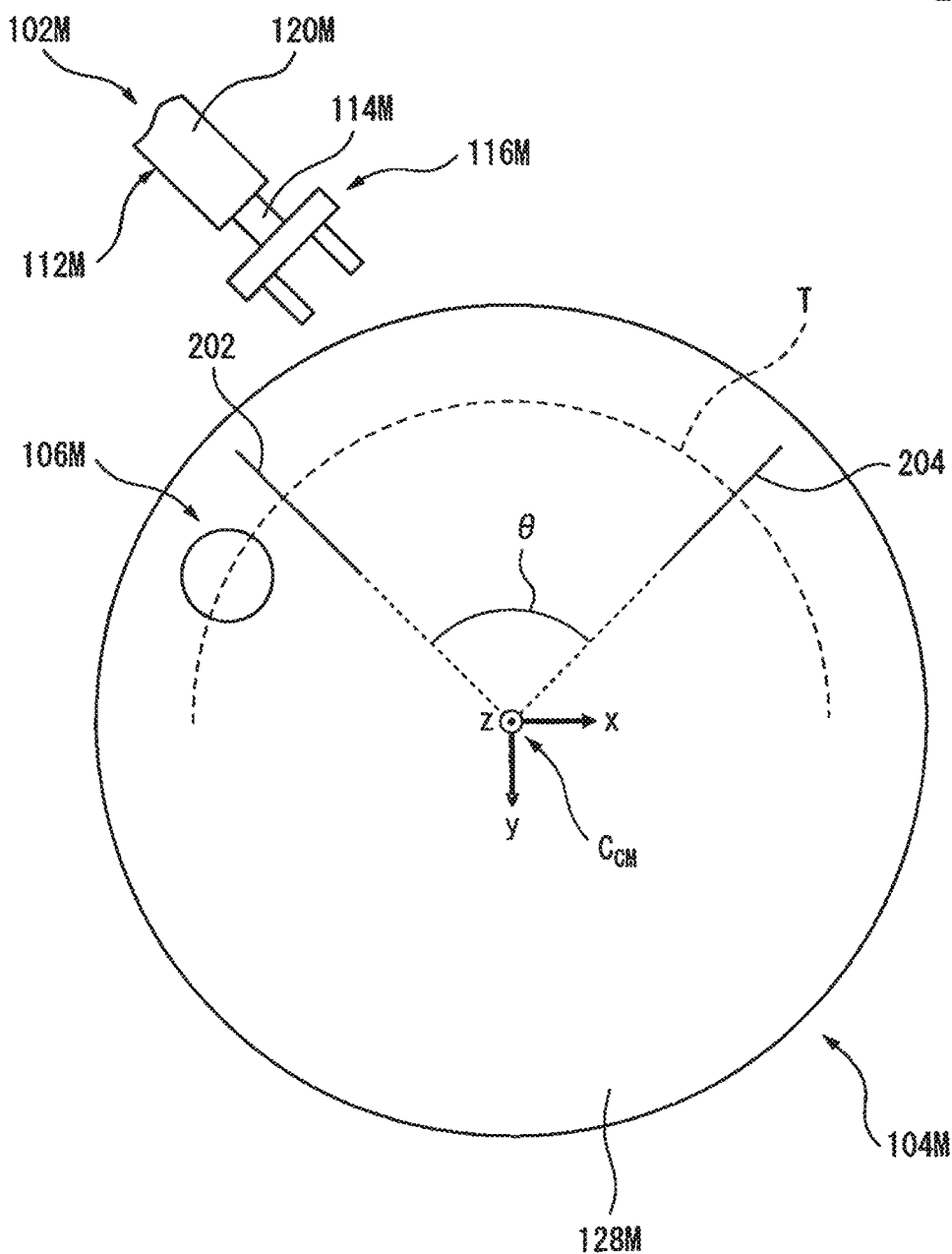
FIG. 10 is a drawing for explaining step S6 in FIG. 3, and corresponds to the image of the virtual space illustrated in FIG. 8.

At this time, the upstream end 202 is arranged downstream from the detection device model 106M. As a result, as illustrated in FIGS. 9 and 10, the following operation range is set as the range between the upstream end 202 and the downstream end 204.

Thus, in this embodiment, the CPU 12 functions as an operation range setting section 36 (FIG. 1) configured to set the following operation range in the virtual space 200.

Note that, when the following operation range is set, the CPU 12 may move the upstream end 202 or the downstream end 204 of the following operation range in the virtual space 200 in response to input data from the data input section 20.

For example, when the following operation range is set, the user operates the data input section 20 (e.g. a mouse) so as to move (e.g. drag and drop) the upstream end 202 or the downstream end 204 displayed on the display 22. The CPU 12 moves the upstream end 202 or the downstream end 204 in the virtual space 200 in response to the input data from the data input section 20 input by the user.

Note that, if the position of the detection device model 106M in the x-y plane of the conveyer coordinate system model $C_{CM}$ is within the following operation range as a result of moving the upstream end 202 or the downstream end 204 in response to the input data from the user, the CPU 12 may prohibit the movement of the upstream end 202 or the downstream end 204 or display a warning image on the display 22.

In step S7, the CPU 12 determines a supply method for supplying the workpiece model in the virtual space 200 when executing step S8 described later. Parameters related to the supply method of the workpiece model include e.g. a supply range of the workpiece model, a convey speed of the workpiece model, the number of workpiece models to be supplied, a spacing between workpiece models, and an offset amounts of the position and orientation of the workpiece model.

The supply range of the workpiece model is a range in which the conveyer model 104M conveys the workpiece model in the virtual space 200 when executing step S8 described later, and is defined by an upstream end and a downstream end arranged on the virtual track T.

The upstream end of the supply range defines a position where the workpiece model is placed on the turntable model 128M in step S8. The downstream end of the supply range defines an end point of a path on which the conveyer model 104M conveys the workpiece model in the virtual space 200. As an example, the supply range of the workpiece model is defined by an angle (e.g. 180°).

The convey speed of the workpiece model is a speed by which the conveyer model 104M conveys the workpiece model when executing following step S8, and corresponds to a rotation speed of the turntable model 128M.

The number of workpiece models to be supplied is the total number of workpiece models supplied on the turntable model 128M when executing following step S8. The spacing between workpiece models is a distance between two workpiece models adjacent to each other when supplied on the turntable model 128M in step S8 described below.

The offset amount of the position of the workpiece model is an amount of offset from the virtual track T (e.g. ±10 mm from the virtual track T in the radial direction) when supplying the workpiece model on the turntable model 128M in following step S8.

The offset amount of the posture of the workpiece model is an amount of offset (e.g. ±5°) of the posture of the workpiece model (e.g., the angle of the longitudinal direction of the workpiece model with respect to the y-axis of the conveyer coordinate system model $C_{CM}$ when viewing the workpiece model from the z-axis direction of the conveyer coordinate system model $C_{CM}$) when the workpiece model is supplied on the turntable model 128M in following step S8.

As an example, the CPU 12 generates input image data that enables the user to input the parameters related to the supply method of the workpiece model (i.e., the supply range of the workpiece model, the convey speed of the workpiece model, the number of supplied workpiece models, the spacing between workpiece models, and the offset amounts of the position and orientation of the workpiece model), and displays it on the display 22.

The user operates the data input section 20 and inputs a desired parameter on the input image displayed on the display 22. The data input section 20 sends the input data input by the user to the CPU 12 via the I/O interface 18.

Figure 11:
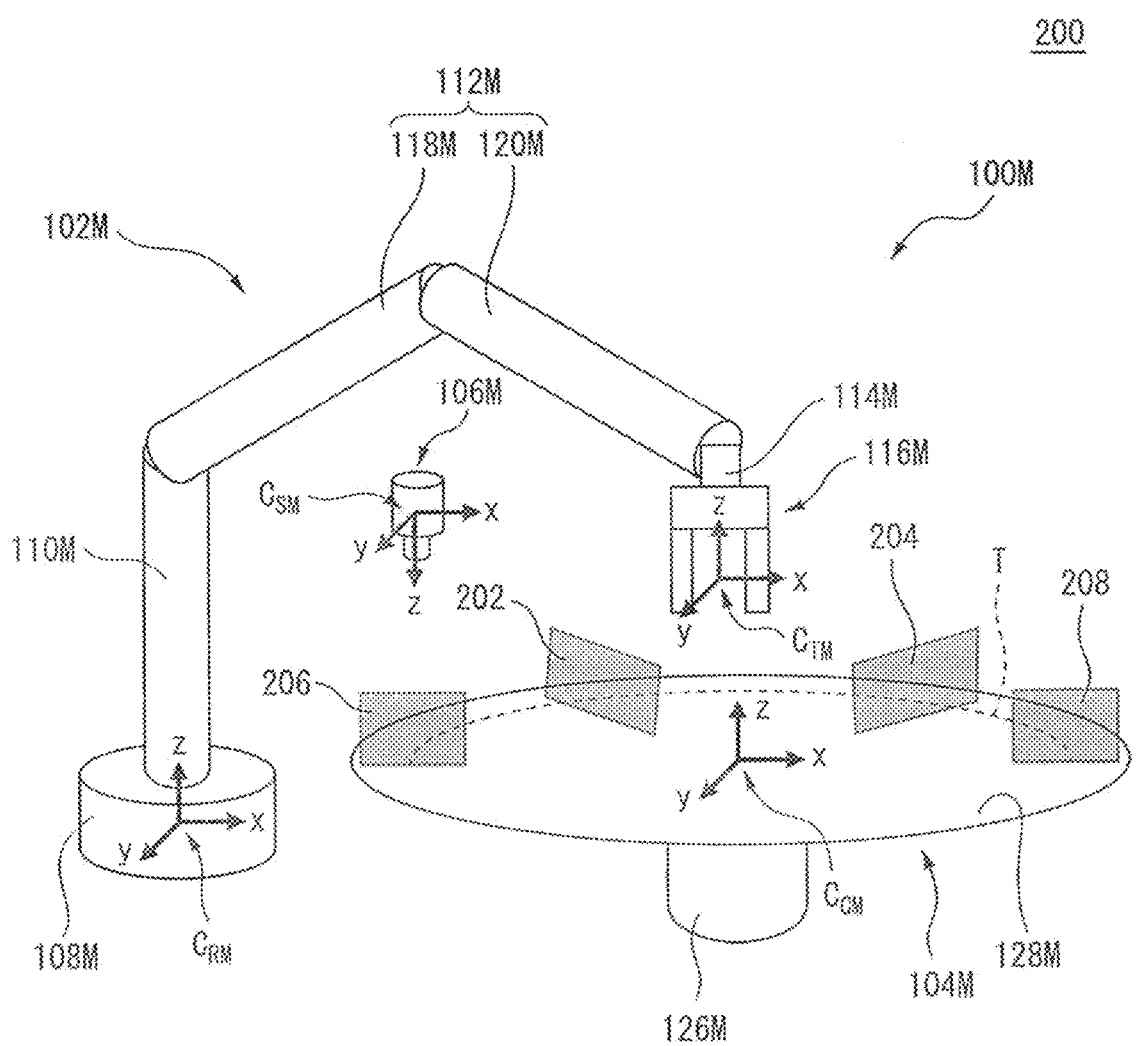
FIG. 11 is a drawing for explaining step S7 in FIG. 3, and corresponds to the image of the virtual space illustrated in FIG. 9.
Figure 12:
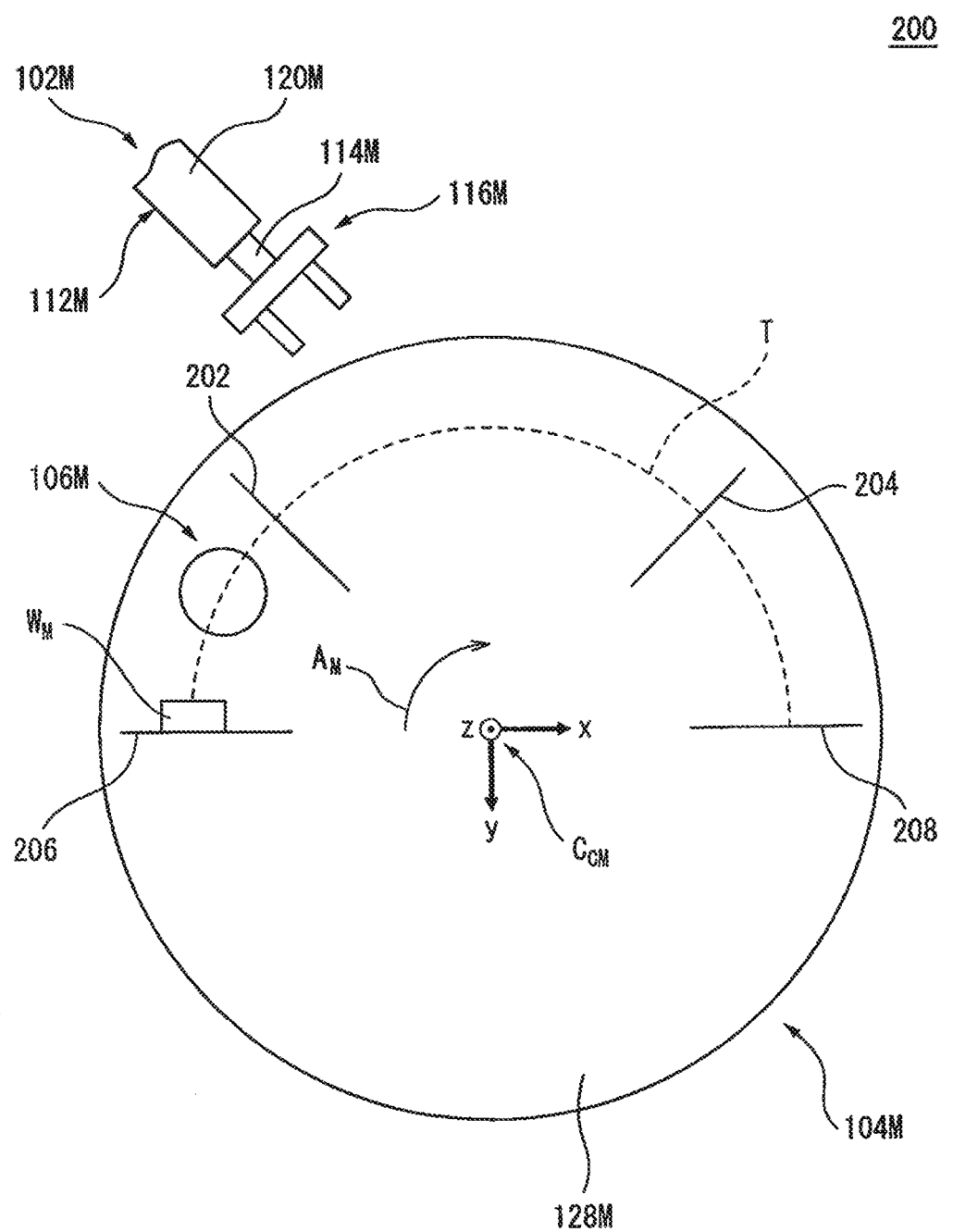
FIG. 12 is a drawing for explaining step S7 in FIG. 3, and corresponds to the image of the virtual space illustrated in FIG. 10.

The CPU 12 determines the supply method of the workpiece model when executing following step S8, in accordance with the parameters included in the received input data. For example, if the user inputs "180°" as the supply range of the workpiece model, as illustrated in FIGS. 11 and 12, the CPU 12 sets the upstream end 206 and the downstream end 208 of the supply range on the virtual track T at the radius R determined in step S4.

At this time, the upstream end 206 is arranged upstream from the upstream end 202 of the following operation range, while the downstream end 208 of the supply range is arranged downstream from the downstream end 204 of the following operation range. In this way, as illustrated in FIGS. 9 and 10, the supply range of the workpiece model is set as a range between the upstream end 206 and the downstream end 208.

Additionally, in accordance with input data input by the user, the CPU 12 sets the various parameters related to the supply method of the workpiece model that are to be used in following step S8, such as the convey speed of the workpiece model, the number of workpiece models to be supplied, the spacing between workpiece models, and the offset amounts of the position and orientation of the workpiece model.

Thus, in this embodiment, the CPU 12 functions as a supply determination section 38 (FIG. 1) configured to determine the supply method for supplying the workpiece model in the virtual space 200.

In step S8, the CPU 12 executes a simulation to operate the conveyer system model 100M in the virtual space 200. Specifically, the CPU 12 arranges a workpiece model $W_M$ at the position of the upstream end 206 of the supply range determined in step S7.

At this time, the CPU 12 arranges the workpiece model $W_M$ in accordance with the offset amounts of the position and orientation of the workpiece model $W_M$ determined in step S7. As a result, the workpiece model $W_M$ is arranged in the virtual space 200 as illustrated in FIG. 12.

Thus, in this embodiment, the CPU 12 functions as a workpiece model arranging section 42 (FIG. 1) configured to arrange the workpiece model $W_M$ on the conveyer model 104M in the virtual space 200.

Then, the CPU 12 operates the conveyer model 104M in the virtual space 200 such that the conveyer model 104M rotates the turntable model 128M about the z-axis of the conveyer coordinate system model $C_{CM}$ in the direction indicated by the arrow $A_M$ in FIG. 12.

At this time, the CPU 12 rotates the turntable model 128M in accordance with the convey speed of the workpiece model $W_M$ determined in step S7. As a result, the workpiece model $W_M$ on the turntable model 128M is conveyed in the direction of the arrow $A_M$, along the virtual track T in the virtual space 200.

After arranging the first workpiece model $W_M$ on the turntable model 128M, the CPU 12 sequentially arranges workpiece models $W_M$ at the position of the upstream end 206 of the supply range, in accordance with the number of workpiece models $W_M$ to be supplied and the spacing determined in step S7.

Then, the CPU 12 operates the detection device model 106M in the virtual space 200 such that the detection device model 106M detects the workpiece model $W_M$ being conveyed. Here, in the above-mentioned step S5, the detection device model 106M is positioned such that the z-axis of the sensor coordinate system model $C_{SM}$ (i.e., the direction of the visual line of the detection device model 106M) is arranged above the virtual track T.

Accordingly, the detection device model 106M can detect an entirety of the workpiece model $W_M$ being conveyed. Based on the visual line data of the detection device model 106M and the position of the workpiece model $W_M$ in the conveyer coordinate system model $C_{CM}$, the CPU 12 generates a virtual detection image (virtual detection result) which is to be obtained when the detection device model 106M detects the workpiece model $W_M$ in the virtual space 200.

Then, the CPU 12 acquires the position and orientation of the workpiece model $W_M$ in the robot coordinate system model $C_{RM}$ from the generated virtual detection image. Then, the CPU 12 operates the robot model 102M in the virtual space 200, based on the acquired position and orientation of the workpiece model $W_M$, the radius R of the virtual track T determined in step S4, the following operation range set in step S6, and a robot program.

Specifically, the CPU 12 sequentially sets the tool coordinate system model $C_{TM}$ so as to continuously arrange the origin of the tool coordinate system model $C_{TM}$ at a predetermined position of the conveyed workpiece model $W_M$ (e.g. the center position of the workpiece model $W_M$).

The CPU 12 operates the robot model 102M in the virtual space 200 so as to arrange the robot hand model 116M at the position and orientation defined by the tool coordinate system model $C_{TM}$.

In this way, the robot model 102M causes the robot hand model 116M to follow the workpiece model $W_M$ within the following operation range in the virtual space 200. Note that, the robot program described above is prestored in the system memory 14.

Then, the CPU 12 operates the robot model 102M in the virtual space 200 so as to grip the workpiece model $W_M$ by the robot hand model 116M.

Figure 13:
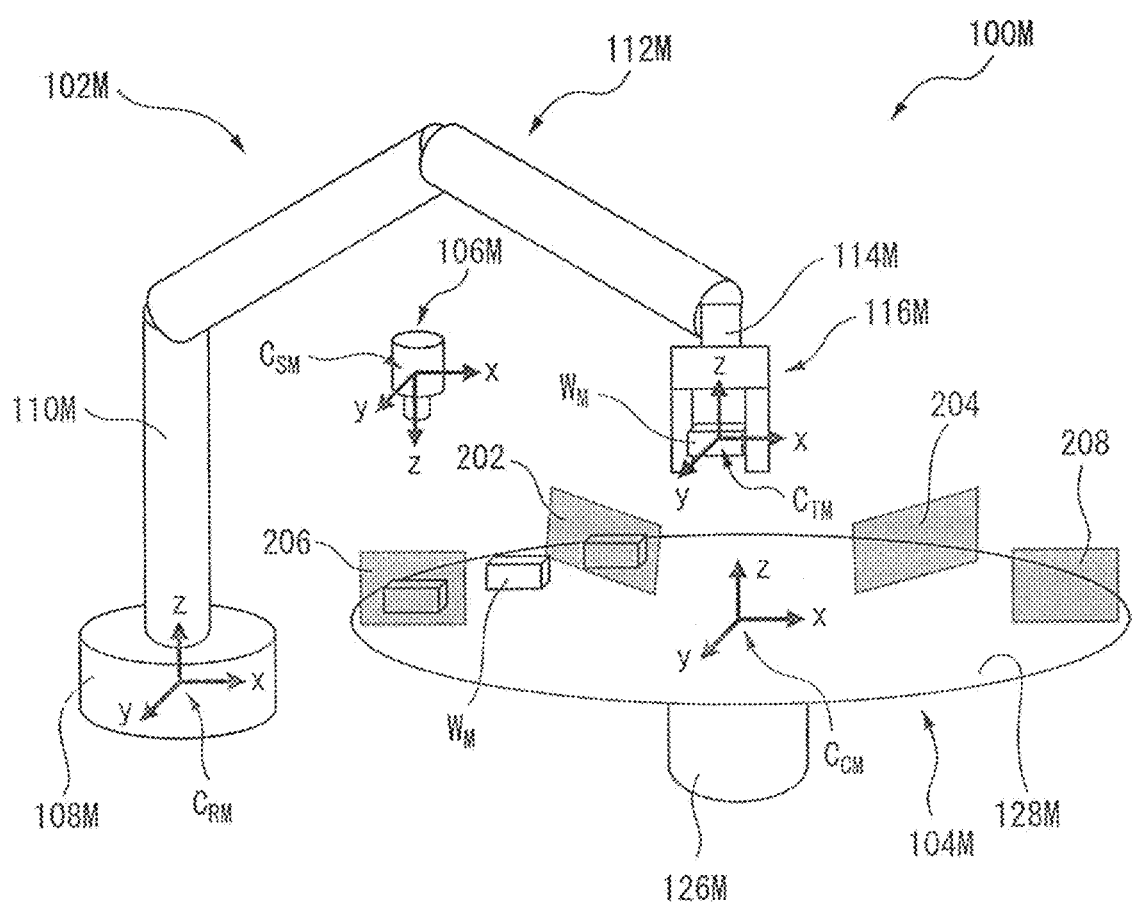
FIG. 13 is a drawing for explaining step S8 in FIG. 3, and corresponds to the image of the virtual space illustrated in FIG. 11.

If the robot program is properly constructed for the supply method of the workpiece model (e.g., the various parameters such as the convey speed, spacing, and offset amounts of the position and orientation of the workpiece model $W_M$) determined in step S7, the robot hand model 116M can properly grip the workpiece model $W_M$ in the virtual space 200, as illustrated in FIG. 13.

On the other hand, if the robot program is not properly constructed, the robot hand model 116M fails to grip the workpiece model $W_M$. In this case, the CPU 12 may display a warning image on the display 22.

The CPU 12 executes the simulation of the operation of the conveyer system model 100M described above. Accordingly, in this embodiment, the CPU 12 functions as a simulation execution section 40 (FIG. 1) configured to execute the simulation.

As described above, in this embodiment, the CPU 12 can simulate the operation of the workpiece conveyer system 100 of conveying the workpiece along the arc-shaped track by the conveyer 104, and following and gripping the conveyed workpiece by the robot 102.

Due to this configuration, it is possible to simulate in advance whether or not the workpiece conveyer system 100 will operate properly in real space, and as a result of this simulation, verify the validity of the supply method of the workpiece (various parameters such as the convey speed, spacing, and offset amounts of the position and orientation of the workpiece) and the robot program. Therefore, the effort and time required to start up the workpiece conveyer system 100 can be significantly reduced.

Additionally, in this embodiment, the CPU 12 determines the radius R of the virtual track T in step S4, and executes the operational simulation of the conveyer system model 100M based on the radius R determined in step S4.

Due to this configuration, it is possible to execute operational simulations of the workpiece conveyer system 100 for various applications in which the convey tracks of the workpiece by the conveyer 104 differ from each other.

Additionally, in this embodiment, the CPU 12 optimizes the position of the detection device model 106M (step S5), in accordance with the radius R determined in step S4. Due to this configuration, the detection device model 106M can reliably detect the workpiece model $W_M$ being conveyed in the virtual space 200 at the time of executing step S8, even when the user randomly determines the radius of the virtual track T in step S4.

Additionally, in this embodiment, the user can define the following operation range by the angle θ. Due to this configuration, the user can intuitively and easily set the range, in which the robot hand model 116M follows the workpiece model $W_M$ during execution of step S8, to the arc-shaped virtual track T.

Note that, in step S8 described above, the CPU 12 may carry out a simulation of an operation of conveying the gripped workpiece model $W_M$ to a location in the virtual space 200 different from the conveyer model 104M, after gripping the workpiece model $W_M$ by the robot hand model 116M.

Figure 14:
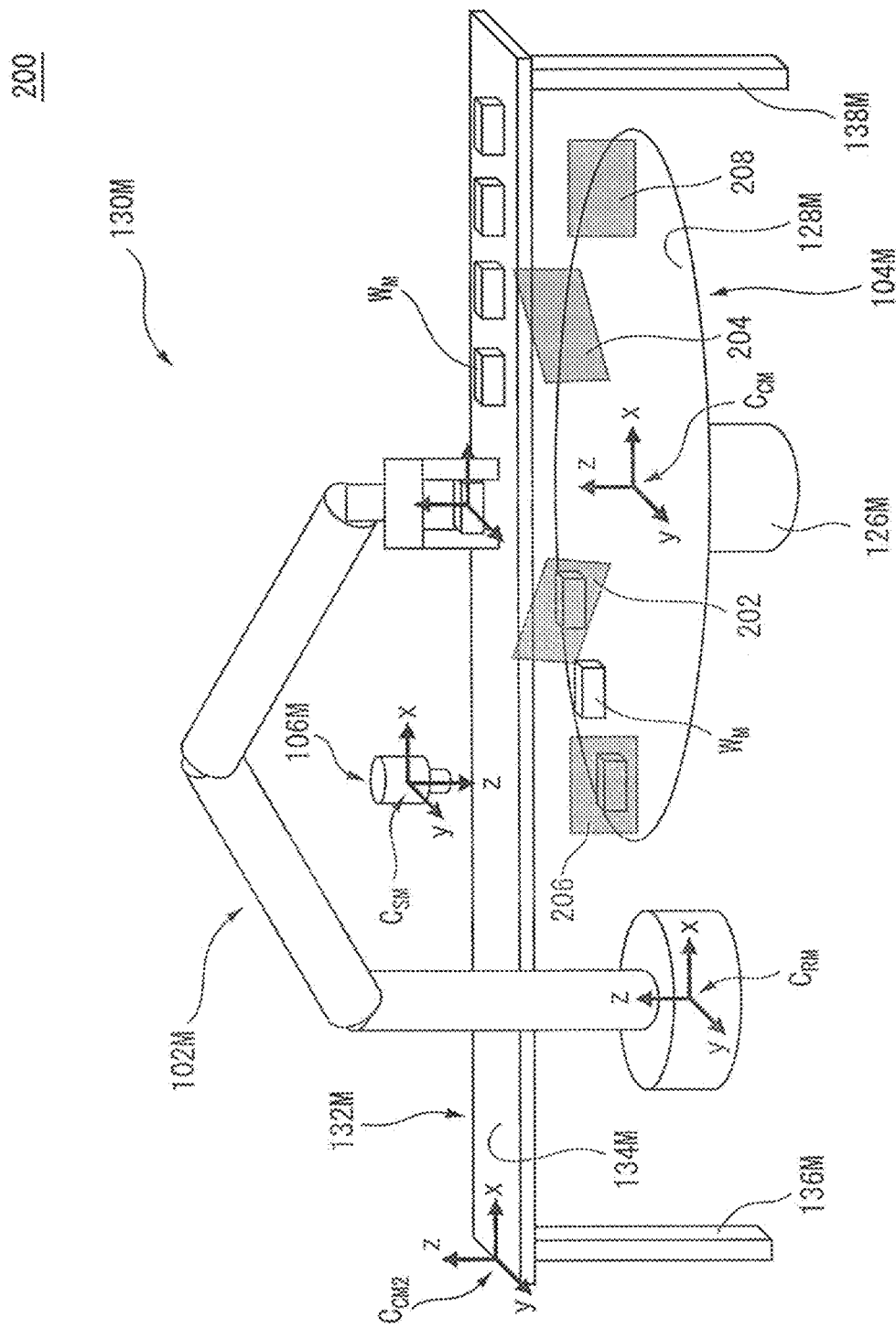
FIG. 14 illustrates an example of virtual space according to another embodiment.

Such a simulation is described with reference to FIG. 14. When carrying out this simulation, in step S2, the CPU 12 arranges a second conveyer model 132M in the virtual space 200, for example.

The second conveyer model 132M includes support part models 136M and 138M, and a conveyor model 134M movable with respect to the support part models 136M and 138M. The second conveyer model 132M has a second conveyer coordinate system model $C_{CM2}$. The second conveyer model 132M moves the conveyor model 134M in the x-axis plus direction of the second conveyer coordinate system model $C_{CM2}$ in the virtual space 200.

When arranging the second conveyer model 132M in the virtual space 200, the CPU 12 arranges the second conveyer model 132M in the virtual space 200 such that at least a part of the conveyor model 134M is included in the virtual movable range of the robot model 102M.

Then, in step S8, after gripping the workpiece model $W_M$ by the robot hand model 116M, the CPU 12 operates the robot model 102M in accordance with the robot program so as to place the gripped workpiece model $W_M$ on the moving conveyor model 134M.

The second conveyer model 132M conveys the workpiece model $W_M$ placed on the conveyor model 134M in the x-axis plus direction of the second conveyer coordinate system model $C_{CM2}$. The CPU 12 can carry out such simulation.

Note that, in step S8, the CPU 12 may execute a simulation of an operation of gripping the workpiece model $W_M$, which the second conveyer model 132M conveys by the conveyor model 134M, by the robot hand model 116M, and placing the gripped workpiece model $W_M$ on the turntable model 128M.

Further, in step S8, the CPU 12 may execute a simulation of an operation of placing the gripped workpiece model $W_M$ on the conveyor model 134M while the conveyor model 134M of the second conveyer model 132M is stopped, after gripping the workpiece model $W_M$ by the robot hand model 116M.

Note that, the CPU 12, the system memory 14, the working memory 16, and the I/O interface 18 may be installed in a desktop computer, and the data input section 20 (e.g. a keyboard) and the display 22 (e.g. an LCD) may be externally attached to this desktop computer.

Alternatively, the CPU 12, the system memory 14, the working memory 16, the I/O interface 18, the data input section 20 (e.g. a touch sensor) and the display 22 (e.g. an LCD) may be configured as a single tablet-type computer.

Furthermore, at least one of the system memory 14, the working memory 16, the I/O interface 18, the data input section 20 (e.g. the touch sensor), and the display 22 may be omitted from the simulation device 10.

In this case, the at least one of the omitted system memory 14, the working memory 16, the I/O interface 18, the data input section 20 (e.g. the touch sensor), and the display 22 may be configured as an external device externally attached to the simulation device 10.

Further, in the flow illustrated in FIG. 3, step S3 may be carried out after step S5. For example, the CPU 12 determines the radius R of the virtual track T in accordance with the input data from the user in step S4, and determines the position of the detection device model 106M so that the z-axis of the sensor coordinate system model $C_{SM}$ is arranged above the determined virtual track T in step S5.

Then, in step S3, the CPU 12 arranges the detection device model at the position in the virtual space 200 determined in step S5 which has been most-recently carried out. As a result, as illustrated in FIG. 8, the detection device model 106M is arranged in the virtual space 200 such that the z-axis of the sensor coordinate system model $C_{SM}$ is arranged above the virtual track T.

Further, in step S2 described above, the CPU 12 may arrange the conveyer model 104M in the virtual space 200 such that at least a part of the turntable model 128M is included, in the virtual movable range of the robot model 102M.

Furthermore, in step S3 described above, the user may operate the data input section 20 (e.g. a mouse) so as to move (e.g. drag and drop) the detection device model 106M displayed on the display 22 in the virtual space 200.

In this case, the CPU 12 moves the detection device model 106M in the virtual space 200 in response to the input data from the data input section 20 input by the user. At this time, the CPU 12 may prohibit the movement of the detection device model 106M or display a warning image on the display 22 if the z-axis of the sensor coordinate system model $C_{SM}$ of the detection device model 106M is out of the region of the turntable model 128M.

Further, at least one of the above-mentioned steps S4 and S5 may be omitted. The detection device 106 is not limited to a three-dimensional visual sensor, but may be a device, such as a proximity sensor, which can only detect the presence of the workpiece in a non-contacting manner without detecting the position and orientation of the workpiece.

In this case, in step S8 illustrated in FIG. 3, the CPU 12 arranges the workpiece model $W_M$ at the same position and orientation on the turntable model 128M. Then, the detection device model 106M detects the workpiece model $W_M$ in the virtual space 200 when the workpiece model $W_M$ conveyed by the turntable model 128M passes under the detection device model 106M.

Then, the CPU 12 calculates the position of the workpiece model $W_M$ in the virtual space 200 on the basis of the virtual detection result obtained by the detection device model 106M, and executes a simulation of operation of the robot model 102M causing the robot hand model 116M to follow the workpiece model $W_M$.

Further, in the embodiment described above, the CPU 12 sequentially arranges the workpiece model $W_M$ at the position of the upstream end 206 of the supply range in step S8. However, the CPU 12 may execute a simulation of supplying the workpiece model $W_M$ on the turntable model 128M by a second robot model.

Figure 15:
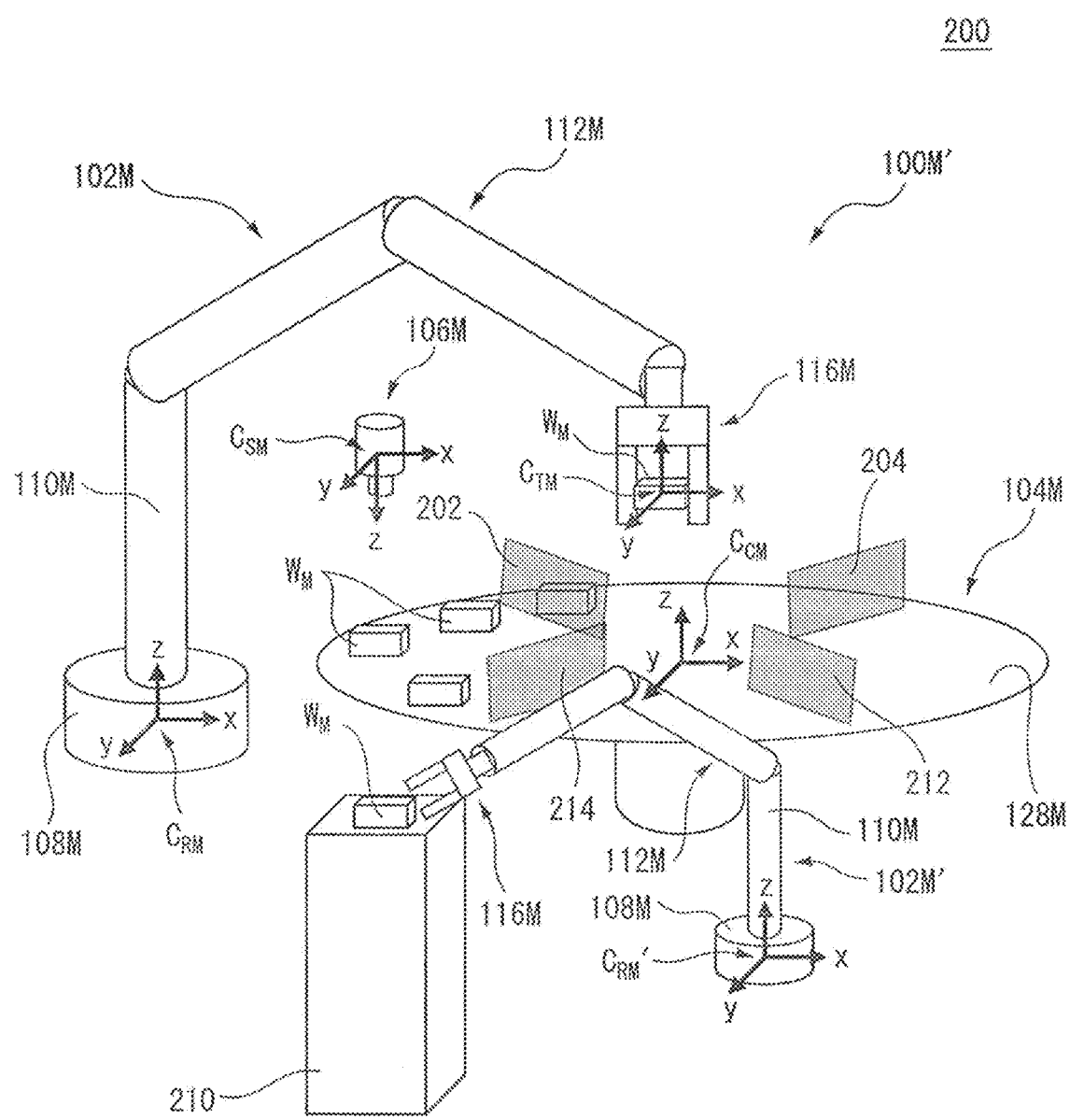
FIG. 15 illustrates an example of virtual space according to still another embodiment.

Such a simulation is described with reference to FIG. 15. A conveyer system model 100M' is arranged in the virtual space 200 illustrated in FIG. 15. The conveyer system model 100M' includes the robot model 102M, a second robot model 102M', the conveyer model 104M, and the detection device model 106M.

The second robot model 102M' includes component models the same as the robot model 102M (i.e., the robot base model 108M, the revolving drum model 110M, the robot arm model 112M, the wrist model 114M, and the robot hand model 116M). Additionally, the second robot model 102M' has a robot coordinate system model $C_{RM}'$.

The second robot model 102M' grips the workpiece model $W_M$ arranged on a fixed stand model 210, and places the gripped workpiece model $W_M$ on the turntable model 128M within a workpiece placement range.

The fixed stand model 210 is arranged at a predetermined location within the virtual movable range of the second robot model 102M'. Further, the workpiece placement range is defined as a range between an upstream end 212 and a downstream end 214. The upstream end 212 of the workpiece placement range is arranged downstream from the downstream end 204 of the following operation range, while the downstream end 214 of the workpiece placement range is arranged upstream from the detection device model 106M.

When executing the simulation according to this embodiment, in step S1 in FIG. 3, the CPU 12 arranges the second robot model 102M' and the fixed stand model 210 in the virtual space 200, in addition to the robot model 102M.

Then, in step S6, the CPU 12 sets the workpiece placement range (i.e., the upstream end 212 and the downstream end 214), in addition to above-described the following operation range. Then, in step S8, the CPU 12 functions as the workpiece model arranging section 42 so as to arrange the workpiece model $W_M$ on the fixed stand model 210.

Then, the CPU 12 operates the second robot model 102M' in the virtual space 200 so that the second robot model 102M' grips the workpiece model $W_M$ arranged on the fixed stand model 210 by the robot hand model 116M.

Then, the second robot model 102M' places the gripped workpiece model $W_M$ on the turntable model 128M within the workpiece placement range set in step S6. At this time, the second robot model 102M' places the gripped workpiece model $W_M$ on the virtual track T for which the radius R thereof is determined in step S4.

Then, as in the embodiment described above, the CPU 12 conveys the workpiece model $W_M$ by the conveyer model 104M, detects the workpiece model $W_M$, which has been placed by the second robot model 102M', by the detection device model 106M, and causes the robot hand model 116M to follow the workpiece model $W_M$ within the following operation range.

Note that, in the embodiments described above, the robot coordinate system model $C_{RM}$ ($C_{RM}'$), the tool coordinate system model $C_{TM}$, the conveyer coordinate system model $C_{CM}$ ($C_{CM2}$), and the sensor coordinate system model $C_{SM}$ are set in the virtual space 200. However, one standard coordinate system model may be set in the virtual space 200, and steps S1 to S8 in FIG. 3 may be executed with using this coordinate system as a standard.

Further, the radius R of the virtual track T in step S4, the following operation range in step S6, or the parameters related to the supply method of the workpiece model in step S7 (i.e., the supply range of the workpiece model, the convey speed of the workpiece model, the number of workpiece models to be supplied, the spacing between workpiece models, and the offset amounts of the position and orientation of the workpiece model) may be automatically determined in accordance with a computer program.

The invention has been described using embodiments, but the embodiments should not be construed to limit the invention recited in the claims. While embodiments including combinations of the features described in the embodiments of the invention may be included in the technical scope of the invention, all combinations of the features are not necessarily essential to the means provided by the aspects of the invention. Furthermore, it is apparent to persons skilled in the art that various alterations and improvements can be added to the embodiments described above.

Additionally, the operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first", "next", or "then" in the claims, embodiments, or diagrams, it does not necessarily mean that the process must be performed in this order.

The invention claimed is:

1. A simulation device configured to simulate an operation of a robot with a robot hand causing the robot hand to follow a moving workpiece, the simulation device comprising at least one processor configured to:

arrange a robot model including a robot hand model in virtual space, the robot model being a three-dimensional model of the robot, the robot hand model being a three-dimensional model of the robot hand, arrange a conveyer model in the virtual space, the conveyer model being a three-dimensional model of a conveyer configured to convey the workpiece along an arc-shaped track, wherein at least a part of a virtual track in the virtual space corresponding to the arc-shaped track is included in a virtual movable range in which the robot model can move the robot hand model, arrange a workpiece model on the conveyer model in the virtual space, the workpiece model being a three-dimensional model of the workpiece, arrange a detection device model in the virtual space such that the detection device model can detect a workpiece model conveyed by the conveyer model, and arrange a sensor coordinate system model ($C_{CM}$), including a z-axis which defines a visual line direction of the detection device model, together with the detection device model, the detection device model being a three-dimensional model of a detection device configured to detect the workpiece, receive an input of a radius of the virtual track, where a z-axis of a conveyer coordinate system model ($C_{CM}$) represents a center of a circle traced out by the radius, set the received radius as a radius of the virtual track for when a simulation is executed, adjust, based on the set radius, a position of the detection device model, which has been arranged in the virtual space, with reference to the $C_{SM}$ such that the position of the detection device model is arranged above the virtual track in the virtual space, in the positive z-axis direction of the $C_{CM}$, set a following operation range, in which the robot model causes the robot hand model to follow the workpiece model conveyed by the conveyer model, in the virtual space, in response to receiving an input for movement of an upstream end or a downstream end of the following operation range causing the position of the detection device model in an x-y plane of the $C_{CM}$ to be within the following operation range, prohibit the movement of the upstream end or the downstream end of the following operation range, and execute a simulation in which the conveyer model conveys the workpiece model along the virtual track, the detection device model detects the conveyed workpiece model, and the robot model causes the robot hand model to follow the workpiece model within the following operation range based on a virtual detection result of the workpiece model obtained by the detection device model and on the radius.

2. The simulation device of claim 1, wherein the processor is further configured to execute a simulation in which the robot model grips the workpiece model by the robot hand model when the robot model causes the robot hand model to follow the workpiece model within the following operation range and conveys the gripped workpiece model to a location in the virtual space different from the conveyer model.

3. The simulation device of claim 1, wherein the processor is further configured to:
arrange a second robot model with a second robot hand model in the virtual space, and
execute a simulation in which the second robot model grips the workpiece model, which is arranged at a location in the virtual space different from the conveyer model, by the second robot hand model and places the gripped workpiece model on the conveyer model.

4. The simulation device according to claim 1, wherein the detection device model is arranged to align with the circumference of a circle defined by the input radius.

5. The simulation device of claim 1, wherein the processor is further configured to:
adjust the position of the detection device model with reference to the $C_{SM}$ arranged at a positional relation with the conveyer coordinate system model, the positional relation determined by the set radius.

6. A method of simulating an operation of a robot with a robot hand causing the robot hand to follow a moving workpiece, the method comprising:
arranging a robot model including a robot hand model in virtual space, the robot model being a three-dimensional model of the robot, the robot hand model being a three-dimensional model of the robot hand;
arranging a conveyer model in the virtual space, the conveyer model being a three-dimensional model of a conveyer configured to convey the workpiece along an arc-shaped track, wherein at least a part of a virtual track in the virtual space corresponding to the arc-shaped track is included in a virtual movable range in which the robot model can move the robot hand model;
arranging a workpiece model on the conveyer model in the virtual space, the workpiece model being a three-dimensional model of the workpiece;
arranging a detection device model in the virtual space such that the detection device model can detect a workpiece model conveyed by the conveyer model, the detection device model being a three-dimensional model of a detection device configured to detect the workpiece;
receiving an input of a radius of the virtual track;
setting the received radius as a radius of the virtual track for when a simulation is executed;
based on the set radius, adjusting a position of the detection device model arranged in the virtual space, such that the detection device model is arranged above the virtual track in the virtual space;
setting a following operation range, in which the robot model causes the robot hand model to follow the workpiece model conveyed by the conveyer model, in the virtual space;
in response to receiving an input for movement of an upstream end or a downstream end of the following operation range causing the position of the detection device model in an x-y plane of a conveyer coordinate system model ($C_{CM}$) to be within the following operation range, prohibiting the movement of the upstream end or the downstream end of the following operation range; and
executing a simulation in which the conveyer model conveys the workpiece model along the virtual track the detection device model detects the conveyed workpiece model, and the robot model causes the robot hand model to follow the workpiece model within the following operation range based on a virtual detection result of the workpiece model obtained by the detection device model and on the set radius.

7. A non-transitory medium containing a computer program configured to cause a computer to execute the method of claim 6.

* * * * *